(12) United States Patent
Huang et al.

(10) Patent No.: US 10,238,006 B2
(45) Date of Patent: Mar. 19, 2019

(54) HEAT DISSIPATING MODULE

(71) Applicant: Wistron Corporation, New Taipei (TW)

(72) Inventors: Xiao-Ju Huang, New Taipei (TW); Zhao-Ping Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 296 days.

(21) Appl. No.: 15/283,442

(22) Filed: Oct. 2, 2016

(65) Prior Publication Data

US 2017/0321721 A1 Nov. 9, 2017

(30) Foreign Application Priority Data

May 5, 2016 (CN) .......................... 2016 1 0297234

(51) Int. Cl.
| | | |
|---|---|---|
| *H05K 7/20* | (2006.01) | |
| *F04D 25/06* | (2006.01) | |
| *F04D 25/14* | (2006.01) | |
| *F04D 29/60* | (2006.01) | |

(52) U.S. Cl.
CPC ..... *H05K 7/20181* (2013.01); *F04D 25/0613* (2013.01); *F04D 25/14* (2013.01); *F04D 29/601* (2013.01)

(58) Field of Classification Search
CPC .... F04D 25/14; F04D 25/0613; F04D 29/601; H05K 7/20181; H05K 7/20
See application file for complete search history.

(56) References Cited

U.S. PATENT DOCUMENTS 8,120,910 B2 * 2/2012 Hong ................ H05K 7/20181
361/695
2014/0211419 A1 7/2014 Liao

FOREIGN PATENT DOCUMENTS

| CN | 101105307 | 1/2008 |
|---|---|---|
| CN | 203857646 | 10/2014 |
| CN | 204406300 | 6/2015 |
| TW | 224707 | 6/1994 |
| TW | 200915963 | 4/2009 |
| TW | I505767 | 10/2015 |

OTHER PUBLICATIONS

"Office Action of Taiwan Counterpart Application," dated May 3, 2017, p. 1-p. 6.
"Office Action of Taiwan Counterpart Application," with partial English translation thereof, dated Jun. 20, 2017, p. 1-p. 6.

* cited by examiner

*Primary Examiner* — Jason Shanske
*Assistant Examiner* — Maxim Adjagbe
(74) *Attorney, Agent, or Firm* — JCIPRNET (57) ABSTRACT

A heat dissipating module including a casing, a fan, a plurality of blades and at least one locking element is provided. The casing has a first positioning side and a second positioning side opposite each other, and the casing includes a sliding recess located on the first positioning side. The fan is disposed in the casing. The blades respectively slide into the sliding recess and are positioned on the first positioning side and the second positioning side. The locking element passes through the sliding recess to limit the blades from moving out of the sliding recess.

10 Claims, 7 Drawing Sheets

HEAT DISSIPATING MODULE

CROSS-REFERENCE TO RELATED APPLICATION

This application claims the priority benefit of China application serial no. 201610297234.6, filed on May 5, 2016. The entirety of the above-mentioned patent application is hereby incorporated by reference herein and made a part of this specification.

BACKGROUND OF THE INVENTION

Field of the Invention

The invention relates to a heat dissipating module, and more particularly to a heat dissipating module for an electronic device.

Description of Related Art

In recent years, with the rapid development of technology, there has been an increasing demand for electronic devices. In addition, as electronic devices are being improved in performance, electronic components used inside the electronic devices are continuously being enhanced in heating power. As a precaution against failure of the electronic components due to overheating, it is necessary for the electronic devices to provide a sufficient heat dissipation effect on the electronic components. For example, generally, a heat dissipating module, e.g., a technical means for transmitting heat energy out by heat conduction or heat convection, such as a heat dissipating fan, a heat dissipation fin or a thermal grease, etc., may be additionally installed in an electronic device, so as to transmit the heat energy generated by an electronic component outside the electronic device and thereby lower temperatures of the electronic component and the entire electronic device.

In an example where a heat dissipating fan is used as the heat dissipating module, such heat dissipating module is generally directly installed inside the electronic device, and provides an air flow flowing outside the electronic device so as to perform heat dissipation for the electronic component. A plurality of blades may be disposed on a casing of the heat dissipating module or on a housing of the electronic device according to needs, so as to adjust a flowing direction of the air flow during operation of the heat dissipating fan, or to prevent the air flow from returning when the heat dissipating fan stops operation. The blades are sequentially arranged at an opening of the casing and are pivotally disposed on two opposite inner sides of the casing. Accordingly, a common approach is to dispose two positioning holes correspondingly on the two opposite inner sides of the casing for two opposite ends of a blade to pass therethrough to be positioned, or to dispose two parallel sliding rails correspondingly on the two opposite inner sides of the casing for the two opposite ends of the blade to slide thereon to be positioned. However, in the former case, the blade or the casing must be bent to allow the blade to pass through and be positioned between the two positioning holes; in the latter case, the blade is likely to fall off the open parallel sliding rails.

SUMMARY OF THE INVENTION

The invention provides a heat dissipating module that is easily assembled and detached and that is stably positioned.

The heat dissipating module of the invention includes a casing, a fan, a plurality of blades and at least one locking element. The casing has a first positioning side and a second positioning side opposite each other, and the casing includes a sliding recess located on the first positioning side. The fan is disposed in the casing. The blades respectively slide into the sliding recess and are positioned on the first positioning side and the second positioning side. The locking element passes through the sliding recess to limit the blades from moving out of the sliding recess.

Based on the above, in the heat dissipating module of the invention, the sliding recess is disposed on the casing, such that the blades are easily assembled onto or detached from the casing by sliding into or out of the sliding recess. Moreover, after the blades are assembled to the casing, the locking element passes through the sliding recess to limit the blades from moving out of the sliding recess. Also, the locking element may be detached from the sliding recess so as to allow the blades to be removed from the sliding recess according to needs. In this way, each of the blades independently moves in the sliding recess to be assembled or detached. Moreover, in the above assembly and detachment methods, there is no need to bend the blades or the casing. The assembly method using structural engagement instead of sticking or locking also facilitates the assembly or detachment of the blades. Accordingly, the heat dissipating module of the invention is easily assembled and detached and is stably positioned.

To make the above features and advantages of the invention more comprehensible, embodiments accompanied with drawings are explained in detail as follows.

DETAILED DESCRIPTION OF DISCLOSED EMBODIMENTS

Figure 1:
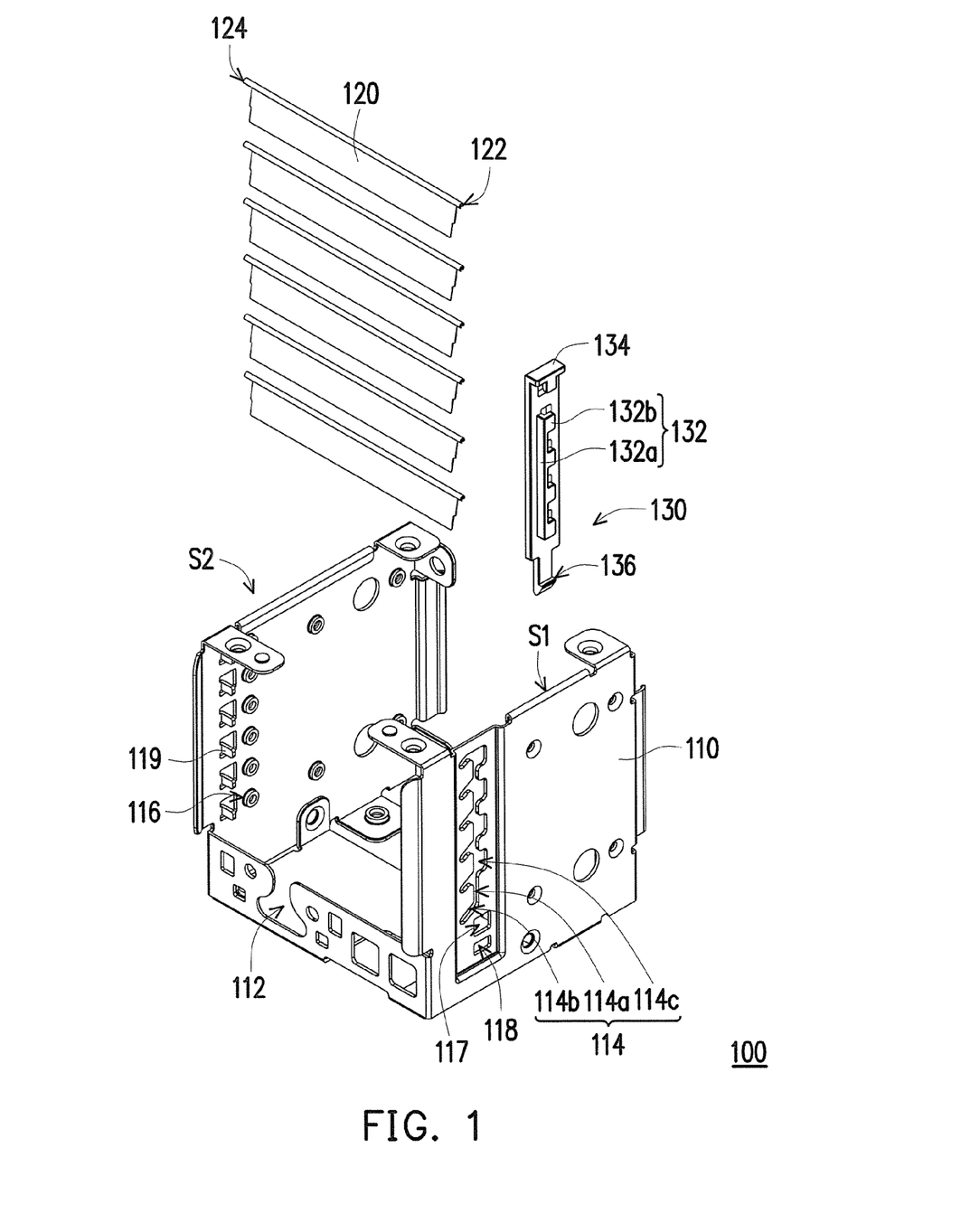
FIG. 1 is a schematic exploded view of a heat dissipating module of the first embodiment of the invention.

FIG. 1 is a schematic exploded view of a heat dissipating module of the first embodiment of the invention. Referring to FIG. 1, in the present embodiment, a heat dissipating module 100 includes a casing 110, a plurality of blades 120, at least one locking element 130, and a fan 140 (illustrated in FIG. 8). The casing 110 has a first positioning side S1 and a second positioning side S2 opposite each other. The first positioning side S1 and the second positioning side S2 are, e.g., two opposite sidewalls of the casing 110. An opening 112 is presented between the two sidewalls, and that is, the opening 112 is located between the first positioning side S1 and the second positioning side S2. Moreover, the casing 110 includes a sliding recess 114 and a plurality of fixing holes 116, wherein the sliding recess 114 is located on the first positioning side S1, and the fixing holes 116 are located on the second positioning side S2. The blades 120 respectively pass through their corresponding fixing holes 116 and slide into the sliding recess 114 so as to be positioned on the first positioning side S1 and the second positioning side S2. The blades 120 are sequentially arranged at the opening 112, and the locking element 130 passes through the sliding recess 114 to limit the blades 120 from moving out of the sliding recess 114. In addition, the fan 140 is disposed in the casing 110 and corresponding to the opening 112 and the blades 120. In this way, the fan 140 provides an air flow pushing the blades 120 and flowing out from the opening 112. When the fan 140 stops providing the air flow, the blades 120 cover the opening 112 so as to prevent the air flow that has flowed out from the opening 112 from returning through the opening 112. Please refer to the following for specific structural characteristics, assembly and detachment steps and operation manner of the heat dissipating module 100.

FIG. 2 to FIG. 5 are schematic views of the heat dissipating module in FIG. 1 in an assembly process. Hereinafter, an assembly method and the specific structural characteristics of the heat dissipating module 100 will be sequentially explained with reference to FIG. 1 in combination with FIG. 2 to FIG. 5.

Figure 2:
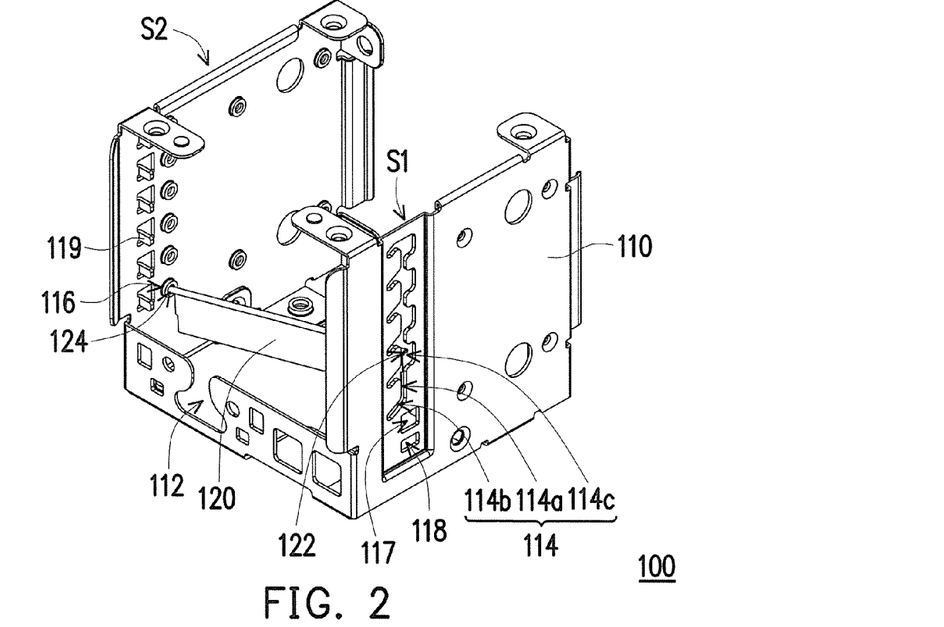
FIG. 2 to FIG. 5 are schematic views of the heat dissipating module in FIG. 1 in an assembly process.
Figure 3:
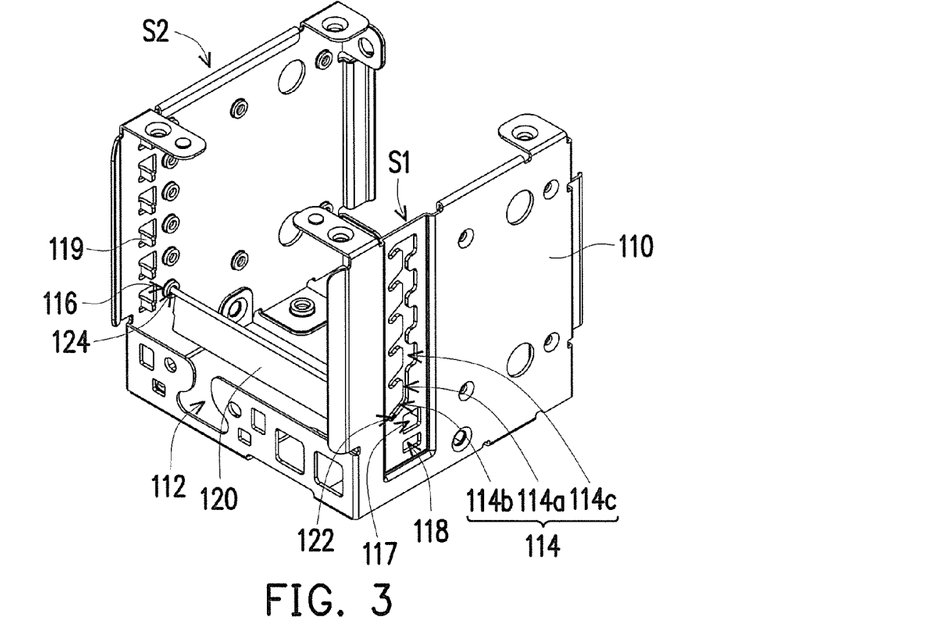

First, referring to FIG. 1 to FIG. 3, in the present embodiment, the blade 120 has a first end 122 and a second end 124 opposite each other for positioning on the first positioning side S1 and the second positioning side S2 respectively. Moreover, the sliding recess 114 located on the first positioning side S1 penetrates through the casing 110, and includes a main passage 114a and a plurality of branches 114b. The main passage 114a is vertically extended on the first positioning side 11 of the casing 110; the branches 114b are obliquely extended from a side edge of the main passage 114a toward outside the main passage 114a and are sequentially arranged. In addition, the fixing holes 116 located on the second positioning side S2 penetrate through the casing 110, and is, e.g., a drawing hole, i.e., a through hole formed by a convex column protruding from the sidewall of the casing 110. However, in other embodiments not illustrated, the fixing holes 116 may be a circular hole directly penetrating through the casing 110 (having no protruding part), or a concave portion formed by inwardly recessing the protruding part on the sidewall of the casing 110 (wherein the concaving portion does not penetrate through the casing 110), and the purpose of positioning the blades 120 on the second positioning side S2 may also be achieved. The invention does not limit how the fixing holes 116 are implemented. The number of the branches 114b corresponds to the number of the blades 120, and the number of the fixing holes 116 corresponds to the number of the blades 120. In this way, the blade 120 is adapted to pass from the main passage 114a through the sliding recess 114 by the first end 122, and then to slide into corresponding one of the branches 114b, so as to be positioned on the first positioning side S1. Moreover, the blade 120 is adapted to pass through corresponding one of the fixing holes 116 by the second end 124, so as to be positioned on the second positioning side S2.

More specifically, in the present embodiment, each of the fixing holes 116 has a size smaller than that of the sliding recess 114. That is, the blade 120 is given a larger movement space at the sliding recess 114 than at corresponding one of the fixing holes 116. Therefore, in the present embodiment, the blade 120 preferably first passes through corresponding one of the fixing holes 116 by the second end 124 to be positioned on the second positioning side S2, then passes through the main passage 114a of the sliding recess 114 by the first end 122 and then slides into corresponding one of the branches 114b, so as to be positioned on the first positioning side S1. However, the invention is not limited thereto. Since each of the branches 114b is obliquely extended from the side edge of the main passage 114a toward outside the main passage 114a, an extension direction of each of the branches 114b and an extension direction of the main passage 114a form an acute angle therebetween (as shown in FIG. 2 to FIG. 3). That is, when the extension direction of the main passage 114a is parallel to a direction of gravity and points toward the ground (i.e., being vertically extended), the extension direction of each of the branches 114b forms an acute angle with the extension direction of the main passage 114a and obliquely extends toward below the casing 110 (i.e., points toward the ground). In this way, after the blade 120 passes through the main passage 114a of the sliding recess 114 by the first end 122 and moves to a connection of the main passage 114a and the corresponding one of the branches 114b, the first end 122 of the blade 120 automatically slides into the corresponding one of the branches 114b by gravity, and is naturally hung at the bottom of the corresponding one of the branches 114b (as shown in FIG. 3), thereby being positioned on the first positioning side S1.

It is thus known that in the present embodiment, since at least one of the first positioning side S1 and the second positioning side S2 of the casing 110 provides a larger movement space (which is achieved in the present embodiment by disposing the sliding recess 114 on the first positioning side S1), the blade 120 is easily assembled onto the casing 110 and positioned on the first positioning side S1 and the second positioning side S2. In this way, compared to the prior art (not illustrated) in which the blade is fixed by two positioning holes, in the heat dissipating module 100 of the present embodiment, there is no need to bend the blade 120 or the casing 110 in order to assemble the blade 120 between the two positioning holes or to be limit by an assembly error generated due to a difference between a distance between the two positioning holes and the size of the blade 120. By simply passing the blade 120 through the fixing hole 116 by the second end 124 and then through the sliding recess 114 by the first end 122, the blade 120 can be automatically positioned on the first positioning side S1 and the second positioning side S2. According to the above, the heat dissipating module 100 of the present embodiment is easily assembled.

Figure 4:
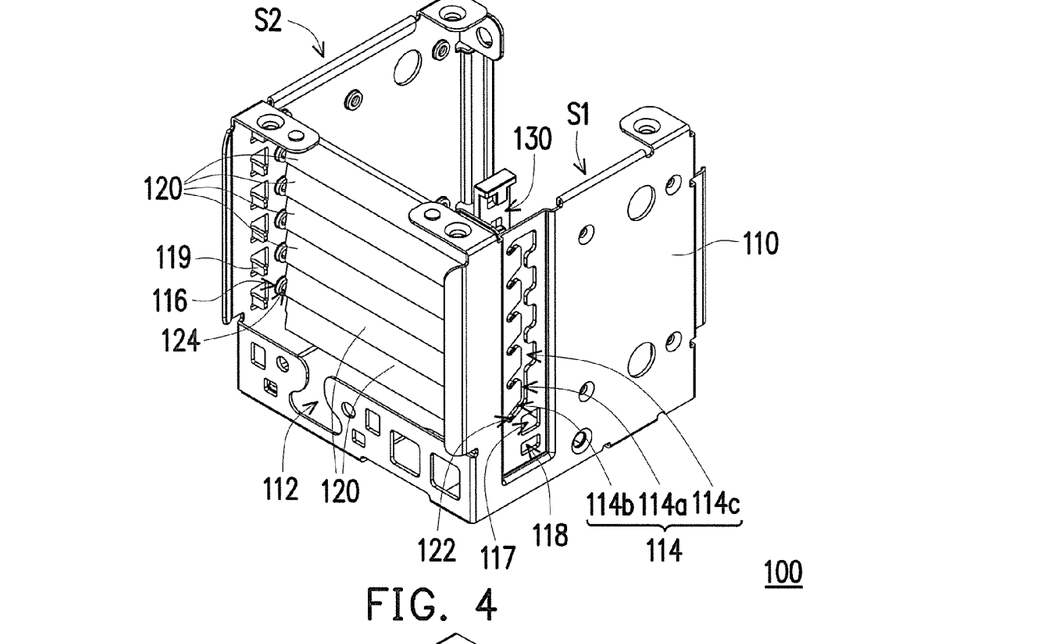
Figure 5:
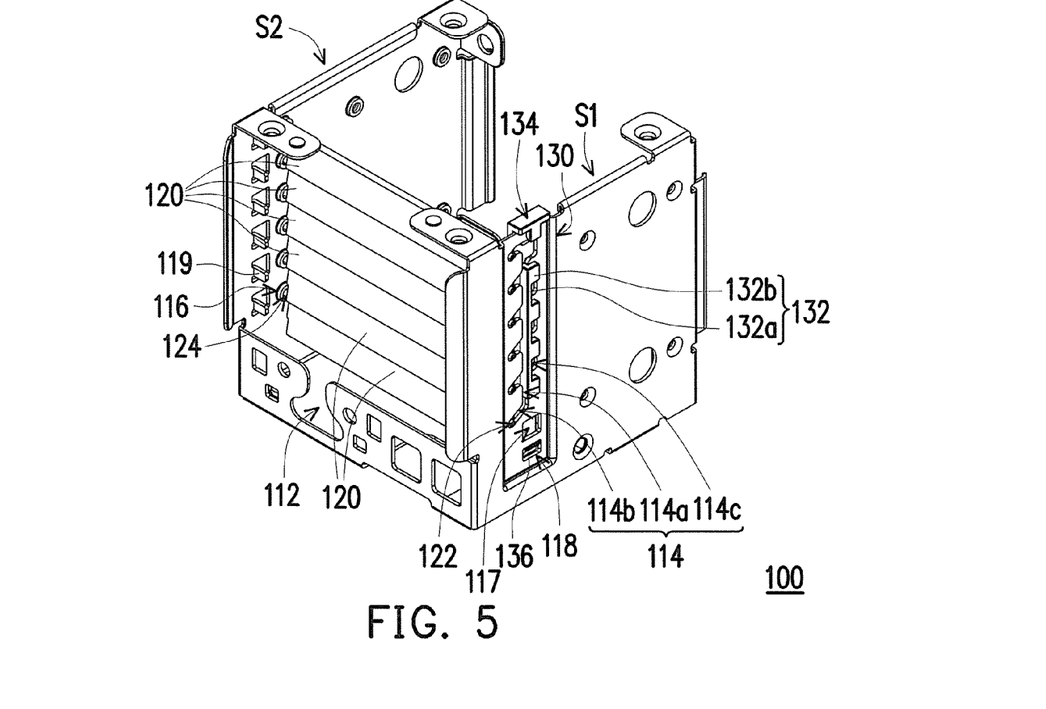

Next, referring to FIG. 4 to FIG. 5, in the present embodiment, the blades 120 are sequentially assembled onto the casing 110 with reference to the steps in FIG. 2 to FIG. 3, and are positioned between the first positioning side S1 and the second positioning side S2 by means of the sliding recess 114 and the fixing hole 116. In this way, the blades 120 are sequentially positioned on the casing 110 and arranged at the opening 112. At this moment, although the first end 122 of each of the blades 120 is disposed at the corresponding one of the branches 114b and positioned on the first positioning side S1, there is still a possibility that the blades 120 may fall off the casing 110 by sliding out of the sliding recess 114. Therefore, in the present embodiment, the locking element 130 passes through the sliding recess 114 to limit the blades 120 from moving out of the sliding recess 114. More specifically, the locking element 130 passes through the main passage 114a to limit the blades 120 from moving from the corresponding branches 114b to the main passage 114a. Hereinafter, how the locking element 130 and the sliding recess 114 are combined together will be explained with reference to FIG. 4 to FIG. 7.

Figure 6:
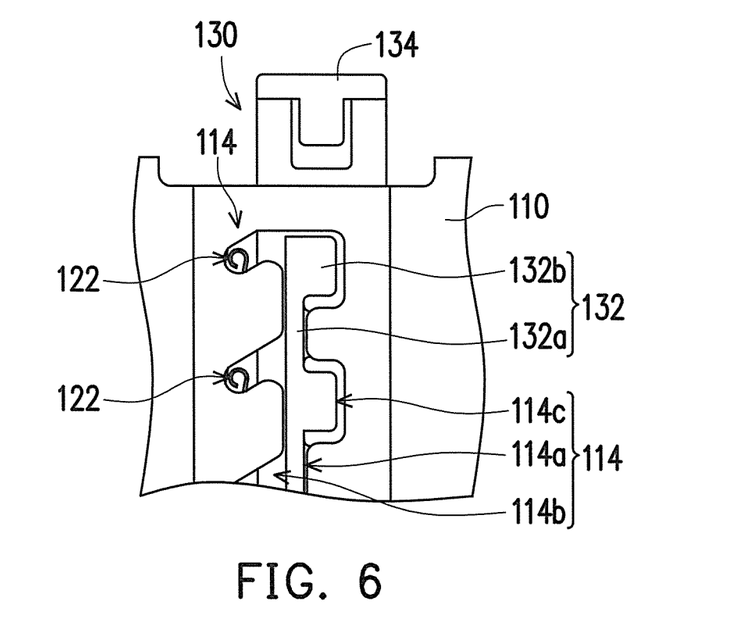
FIG. 6 and FIG. 7 are schematic partial views of a locking element and a sliding recess in FIG. 4 and FIG. 5.
Figure 7:
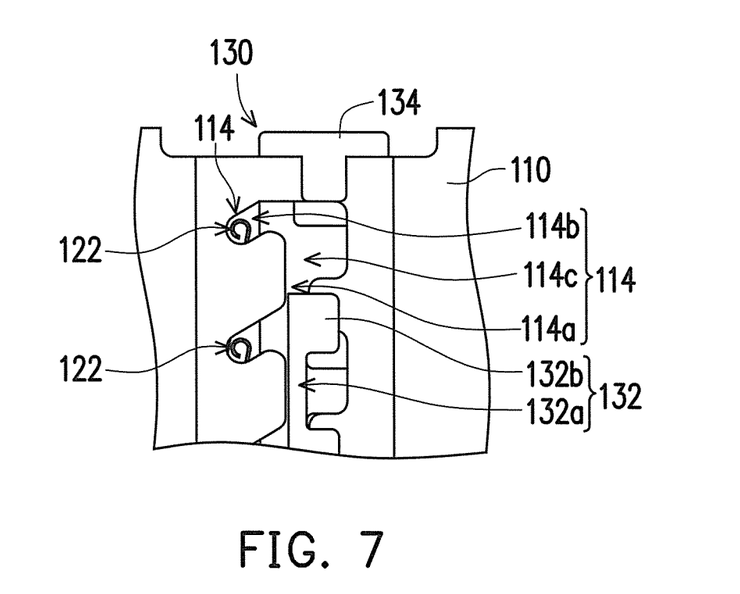

FIG. 6 and FIG. 7 are schematic partial views of a locking element and a sliding recess in FIG. 4 and FIG. 5. Referring to FIG. 4 to FIG. 7, in detail, in the present embodiment, the locking element 130 includes a protrusion structure 132. The protrusion structure 132 includes a protruding portion 132a and a plurality of limiting portions 132b connected to the protruding portion 132a. The protruding portion 132a has a width and an extension direction approximately corresponding to those of the main passage 114a, and is thus adapted to slide along the main passage 114a. In addition, the limiting portions 132b are extended outward from the protruding portion 132a and are sheet-like, and the limiting portions 132b are arranged at intervals in a teeth-like manner. The sliding recess 114 correspondingly has a plurality of notches 114c on a side of the main passage 114a opposite the branches 114b. The number and shape of the limiting portions 132b approximately correspond to those of the notches 114c.

According to the above, in the present embodiment, the locking element 130 passes through the sliding recess 114 by the protrusion structure 132, and moves relative to the sliding recess 114 to form interference with the sliding recess 114, thereby limiting movement of the blades 120. More specifically, the locking element 130 passes through the sliding recess 114 by the limiting portion 132b of the protrusion structure 132 corresponding to the notch 114c of the sliding recess 114 (as shown in FIG. 6). Meanwhile, the protruding portion 132a of the protrusion structure 132 passes through the main passage 114a of the sliding recess 114, such that the locking element 130 is adapted to move relative to the main passage 114a of the sliding recess 114 by the protruding portion 132a, so as to misalign the limiting portion 132b with the notch 114c. When the protruding portion 132a of the locking element 130 is located at the main passage 114a of the sliding recess 114, the sheet-like limiting portion 132b is approximately parallel to a surface of the casing 110, and the limiting portion 132b (i.e., the sheet-like part) has a width greater than that of the main passage 114a. Accordingly, after the limiting portion 132b and the notch 114c are misaligned with each other, the locking element 130 forms interference with the sliding recess 114 (as shown in FIG. 7). In other words, the locking element 130 is able to pass through the main passage 114a only when the limiting portion 132b corresponds to the notch 114c. Right after the locking element 130 passes through the main passage 114a by the limiting portion 132b corresponding to the notch 114c and moves relative to the main passage 114a by the protruding portion 132a to misalign the limiting portion 132b with the notch 114c, the limiting portion 132b forms interference with the main passage 114a, thereby limiting the blades 120 in the corresponding branches 114b and preventing the blades 120 from moving out of the sliding recess 114 through the main passage 114a.

Based on the above, to prevent the locking element 130 from unexpectedly moving because of oscillation and causing the limiting portion 132b to re-correspond to the notch 114c and slide out of the sliding recess 114, in the present embodiment, the locking element 130 further includes a first stopper 134 and a second stopper 136. The first stopper 134 and the second stopper 136 are located respectively on two opposite sides of the locking element 130. More specifically, the first stopper 134 and the second stopper 136 are located respectively on a top end and a bottom end of the locking element 130. The first stopper 134 is, e.g., a lock, and is positioned on the casing 110 after the locking element 130 passes through the sliding recess 114. In addition, the casing 110 includes an avoidance hole 117 and a stopper hole 118 adjacent to each other on the first positioning side S1 below the sliding recess 114. The second stopper 136 is, e.g., a hook. The second stopper 136 is located in the avoidance hole 117 when the locking element 130 passes through the sliding recess 114, and is moved to be fixed in the stopper hole 118, so as to limit the locking element 130 from moving out of the sliding recess 114.

More specifically, in the present embodiment, by means of an appropriate design, the first stopper 134 does not contact the casing 110 when the locking element 130 passes through the sliding recess 114 by the limiting portion 132b corresponding to the notch 114c, but abuts against the casing 110 after the locking element 130 moves relative to the main passage 114a to misalign the limiting portion 132b with the notch 114c. Thus, the locking element 130 is limited from continuing to move along the main passage 114a. Similarly, when the locking element 130 passes through the sliding recess 114 by the limiting portion 132b corresponding to the notch 114c, the second stopper 136 is located in the avoidance hole 117. Next, after the locking element 130 moves relative to the main passage 114a by the protruding portion 132a to misalign the limiting portion 132b with the notch 114c, the second stopper 136 is moved from the avoidance hole 117 to the stopper hole 118 and is further fixed in the stopper hole 118, so as to limit the locking element 130 from moving out of the sliding recess 114 in an opposite direction. In other words, the first stopper 134 is configured to limit a movement path of the locking element 130 after its passage through the sliding recess 114, and the second stopper 136 is configured to limit reverse movement of the locking element 130 after its passage through the sliding recess 114. In addition, when the locking element 130 passes through the sliding recess 114 by the limiting portion 132b corresponding to the notch 114c, the design of the avoidance hole 117 prevents the second stopper 136 from generating interference with a wall surface of the casing 110, such that the locking element 130 may be more easily assembled. However, in other embodiments not illustrated, the first stopper 134 and the second stopper 136 are not limited to a lock or a hook, and may be other fixing means (e.g., a magnet, a screw, etc.). Moreover, either the first stopper 134 or the second stopper 136 may be omitted, or both may be omitted and other positioning means are adopted instead. How the first stopper 134 and the second stopper 136 are implemented and whether to dispose them or not are not limited in the invention, and may be adjusted according to needs.

Referring again to FIG. 5, in the present embodiment, after the locking element 130 passes through the sliding recess 114 and are assembled onto the casing 110, the first end 122 of each of the blades 120 is confined in the corresponding branches 114b. Not only the locking element 130 occupies the sliding recess 114 and thus prevents the blades 120 from moving out of the corresponding branches 114b, the locking element 130 passing through the sliding recess 114 is adjacent to the first end 122 of each of the blades 120 and thus has an interfering effect on the blades 120 to prevent the blades 120 from moving from the corresponding branches 114b to the main passage 114a. In this way, each of the blades 120 suitably uses the first end 122 combined with the corresponding branches 114b as a first pivot point and the second end 124 combined with the fixing hole 116 as a second pivot point, and is thus adapted to rotate relative to the casing 110. However, the blades 120 are unlikely to fall off from the fixing hole 116 and the sliding recess 114 during the rotation.

Particularly, the fixing hole 116 limits the second end 124 of each of the blades 120 at a fixed point. Although the sliding recess 114 provides a larger movement space for the blades 120 to pass therethrough, after the locking element 130 passes through the sliding recess 114, the locking element 130 limits a movement space of the blades 120, and also effectively prevents the blades 120 from unexpectedly moving and falling off from the sliding recess 114. Moreover, the sliding recess 114 provides the larger movement space mainly by the main passage 114a. Hence, the width of the main passage 114a may be adjusted according to needs to facilitate the passage of the blades 120 through the sliding recess 114. Then, by the passage of the locking element 130, the movement of the blades 120 is limited. The design of the notch 114c also increases the movement space provided by the sliding recess 114. That is, the blades 120 may pass through the notch 114c of the sliding recess 114 and then slide through the main passage 114a into the corresponding branches 114b. However, the invention is not limited thereto. On the other hand, the branches 114b are configured to position the blades 120. Hence, although each of the branches 114b is illustrated having a thin and long shape in the present embodiment, in other embodiments not illustrated, each of the branches 114b may be a concave point protruding from the side edge of the main passage 114a, such that the first end 122 of each of the blades 120 is accordingly accommodated in the corresponding branches 114b and positioned on the first positioning side S1. In this way, compared to the prior art (not illustrated) in which the blades are disposed on two parallel sliding rails, in the present embodiment, by disposing specific structural designs such as the main passage 114a and the branches 114b on the sliding recess 114, the passage of the blades 120 therethrough is facilitated. Furthermore, the sliding recess 114 and the blades 120 are interfered by the locking element 130, thereby limiting the movement space of the blades 120. According to the above, the heat dissipating module 100 of the present embodiment is easily assembled and stably positioned.

In addition, in the present embodiment, when a user intends to detach the blades 120 from the casing 110, he/she may, after removing the fan 140 from the casing 110, first detach the locking element 130 from the sliding recess 114 and then detach the corresponding blades 120 alone. Specifically, the detachment of the locking element 130 includes the following steps. First, an external force is applied to release an engagement between the second stopper 136 and the stopper hole 118. Then, the locking element 130 is moved such that the first stopper 134 is moved in a direction away from the casing 110 until the limiting portion 132b re-corresponds to the notch 114c, and the locking element 130 is thereby removed from the sliding recess 114. After that, since the sliding recess 114 provides a larger movement space, the blades 120 are able to be moved along the corresponding branches 114b to the main passage 114a or is further moved to the notch 114c, then easily removed from the sliding recess 114, and then removed from the fixing hole 116. Moreover, since all the branches 114b communicate with the main passage 114a, each of the blades 120 may be independently detached from the sliding recess 114 by the above steps, regardless of whether or not an adjacent blade 120 has been detached. It is thus known that the user neither needs to bend the blades 120 or the casing 110 in order to detach the blades 120, nor needs to detach all the blades 120 in order to replace or repair a single blade 120. According to the above, the heat dissipating module 100 of the present embodiment is easily detached.

Figure 8:
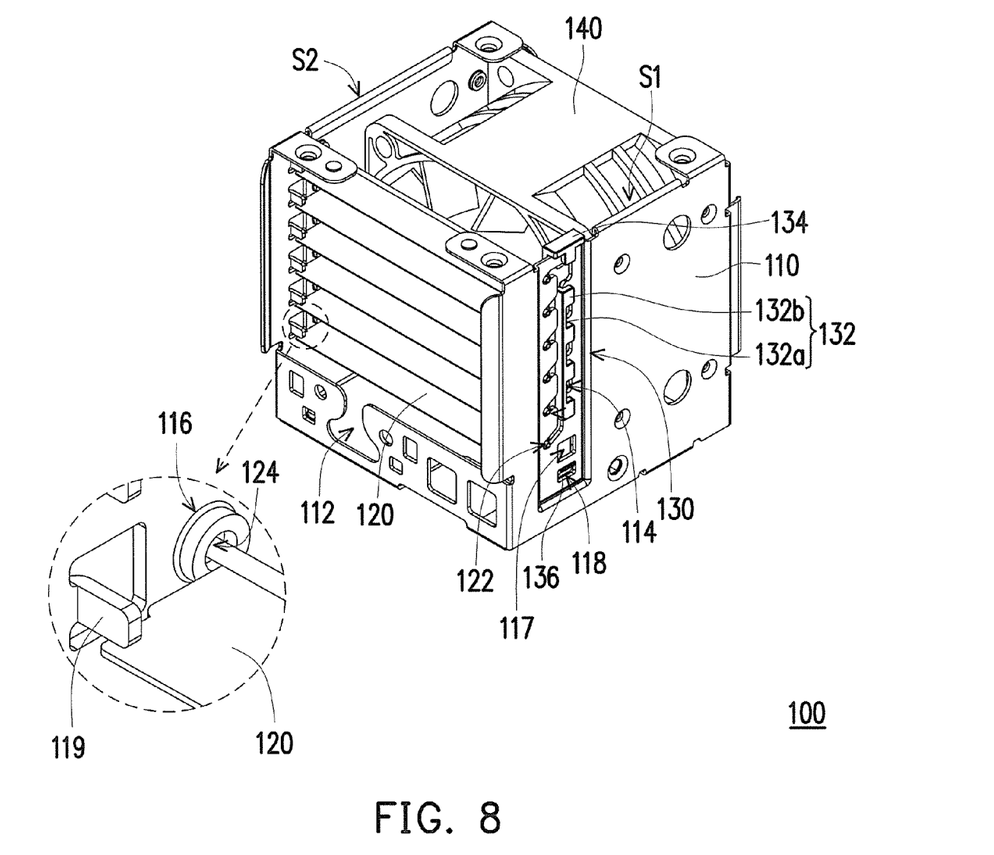
FIG. 8 is a schematic view of the heat dissipating module in FIG. 1 in use.

FIG. 8 is a schematic view of the heat dissipating module in FIG. 1 in use. Referring to FIG. 8, in the present embodiment, after the blades 120 are assembled onto the casing 110 one by one and fixed by the locking element 130, the fan 140 is further disposed in the casing 110 and corresponding to the opening 112 and the blades 120. Then, the heat dissipating module 100 may further be applied in an electronic device (not illustrated), e.g., a server, so as to perform heat dissipation for internal elements of the electronic device. In other words, when the heat dissipating module 100 is in operation, the fan 140 provides an air flow pushing the blades 120 and flowing out from the opening 112, such that heat is dissipated. At this moment, since the blades 120 are pivoted between the first positioning side S1 and the second positioning side S2 of the casing 110, the blades 120 that covers the opening 112 are pushed by the air flow to rotate relative to the casing 110, thereby exposing the opening 112, so as to allow the air flow to flow out of the heat dissipating module 100. On the other hand, when the fan 140 stops providing the air flow, the blades 120 are automatically restored to their original position under the influence of gravity, thereby covering the opening 112 again (as shown in FIG. 5), such that the air flow that has flowed out from the opening 112 is prevented from returning through the opening 112 and affecting the heat dissipation effect of the heat dissipating module 100.

In addition, in the present embodiment, the casing 110 further includes a plurality of limiting elements 119 disposed on the first positioning side S1 or the second positioning side S2 (FIG. 8 shows an example in which the limiting elements 119 are disposed on the second positioning side S2; however, the limiting elements 119 may also be disposed on the first positioning side S1 or on both sides) and corresponding to the blades 120. That is, the number of the limiting elements 119 corresponds to the number of the blades 120, and the limiting elements 119 and the blades 120 are correspondingly arranged adjacent to each other. During the rotation of the blade 120 relative to the casing 110 due to the pushing from the air flow, the limiting element 119 limits a rotation angle of each of the blades 120 rotating relative to the casing 110. In other words, the blades 120 naturally hung on the corresponding branches 114b by gravity are pushed by the air flow provided by the fan 140 to rotate relative to the casing 110 until contact with the limiting elements 119, such that the blades 120 are prevented from excessively or irregularly rotating due to the influence of the air flow and thus interfering with the blades 120 adjacent thereto. However, in other embodiments, the rotation angle of the blades 120 rotating relative to the casing 110 may also be adjusted by controlling an air volume of the fan 140. Whether to dispose the limiting element 119 or not is not limited in the invention, and may be adjusted according to needs.

Figure 9:
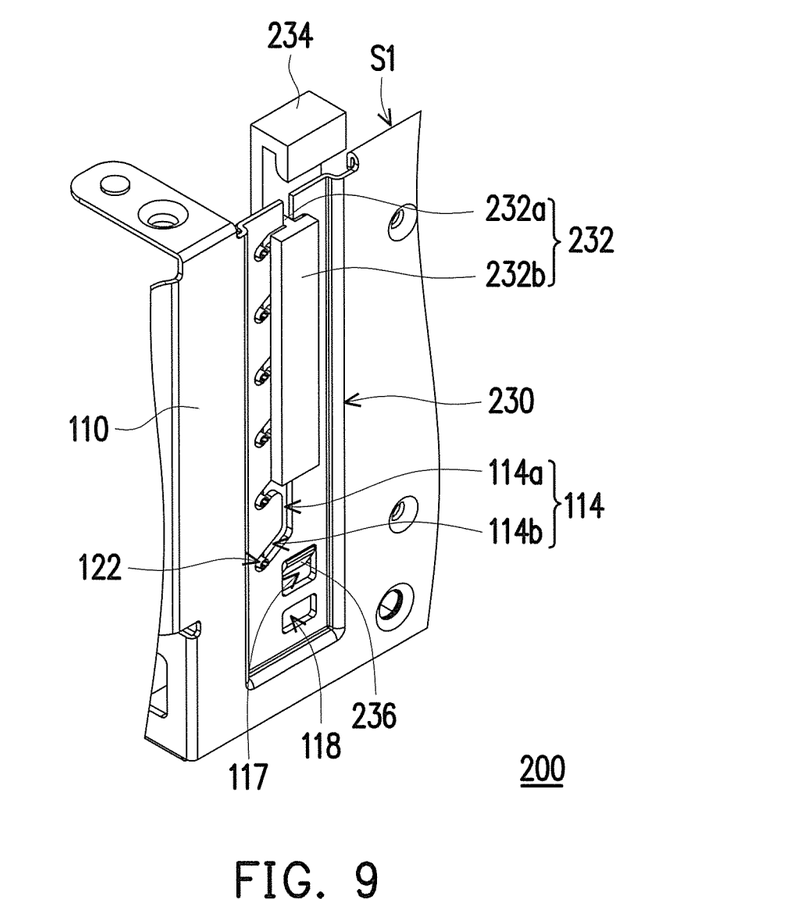
FIG. 9 is a schematic partial view of the heat dissipating module of the second embodiment of the invention.

FIG. 9 is a schematic partial view of the heat dissipating module of the second embodiment of the invention. Referring to FIG. 9, in the present embodiment, a main difference between a heat dissipating module 200 and the aforementioned heat dissipating module 100 lies in that a locking element 230 used in the heat dissipating module 200 differs from the locking element 130 used in the heat dissipating module 100. Therefore, details of the other members and how they are implemented may be understood by referring to the above description and are thus not repeated herein.

In the present embodiment, the locking element 230 includes a protrusion structure 232, the protrusion structure 232 includes a protruding portion 232a and a limiting portion 232b connected to the protruding portion 232a. The protruding portion 232a has a width and an extension direction approximately corresponding to those of the main passage 114a, and is thus adapted to slide along the main passage 114a. In addition, the limiting portion 232b is extended outward from the protruding portion 232a and is sheet-like. That is, after the locking element 230 passes through the main passage 114a of the sliding recess 114 by the protruding portion 232a, the sheet-like limiting portion 232b is approximately parallel to the surface of the casing 110. Moreover, the limiting portion 232b (i.e., the sheet-like part) has a width greater than that of the main passage 114a. It is thus known that the limiting portion 232b of the present embodiment is a single sheet-like part, while the limiting portions 132b (illustrated in FIG. 6 to FIG. 7) of the previous embodiment are a plurality of sheet-like parts arranged at intervals in a teeth-like manner. Based on the above, in the casing 110 of the present embodiment, the notch 114c (illustrated in FIG. 6 to FIG. 7) disposed at the sliding recess 114 may be omitted, and instead, the main passage 114a of the sliding recess 114 is extended to the side edge of the casing 110 for the locking element 230 to slide therein. Similarly, by referring to the present embodiment, the locking element 130 (illustrated in FIG. 5) used in the first embodiment may also slide into the sliding recess 114 from the main passage 114a extended to the side edge of the casing 110, and the notch 114c may be thus omitted. However, since the disposition of the notches 114c also increases the movement spaces of the blades 120 in the assembly or detachment process thereof, the design of the notches 114c may also be retained in the present embodiment. The invention is not limited thereto.

In this way, in the present embodiment, the main passage 114a of the sliding recess 114 is further extended to the side edge of the casing 110 to allow the locking element 230 to slide into the sliding recess 114 from the side edge of the casing 110. The locking element 230 passes through the sliding recess 114 by the protrusion structure 232, and moves relative to the sliding recess 114 to form interference with the sliding recess 114. More specifically, the locking element 230 directly passes through the main passage 114a of the sliding recess 114 from the side edge of the casing 110 by the protruding portion 232a of the protrusion structure 232, and then moves relative to the main passage 114a by the protruding portion 232a such that the limiting portion 232b forms interference with the sliding recess 114. Similarly, since the width of the limiting portion 232b is greater than that of the main passage 114a, the locking element 230 is able to pass through or be removed from the main passage 114a only from where the main passage 114a is extended to the side edge of the casing 110. Similarly, the locking element 230 may also include a first stopper 234 and a second stopper 236 according to needs (specific details of how they are implemented may be understood by referring to the aforementioned first stopper 134 and second stopper 136) for limiting movement of the locking element 230. Moreover, the user may detach the locking element 230 from the sliding recess 114 in accordance with the aforementioned steps (FIG. 9 illustrates a state in which the locking element 230 has slid into the sliding recess 114, the second stopper 236 has engaged in the avoidance hole 117 but has not yet engaged in the stopper hole 118, and the first stopper 134 has not yet contacted the casing 110). According to the above, the heat dissipating module 200 of the present embodiment is easily assembled and detached and is stably positioned. Moreover, it is thus known that how the protrusion structure is implemented is not limited in the invention and may be adjusted according to needs.

Figure 10:
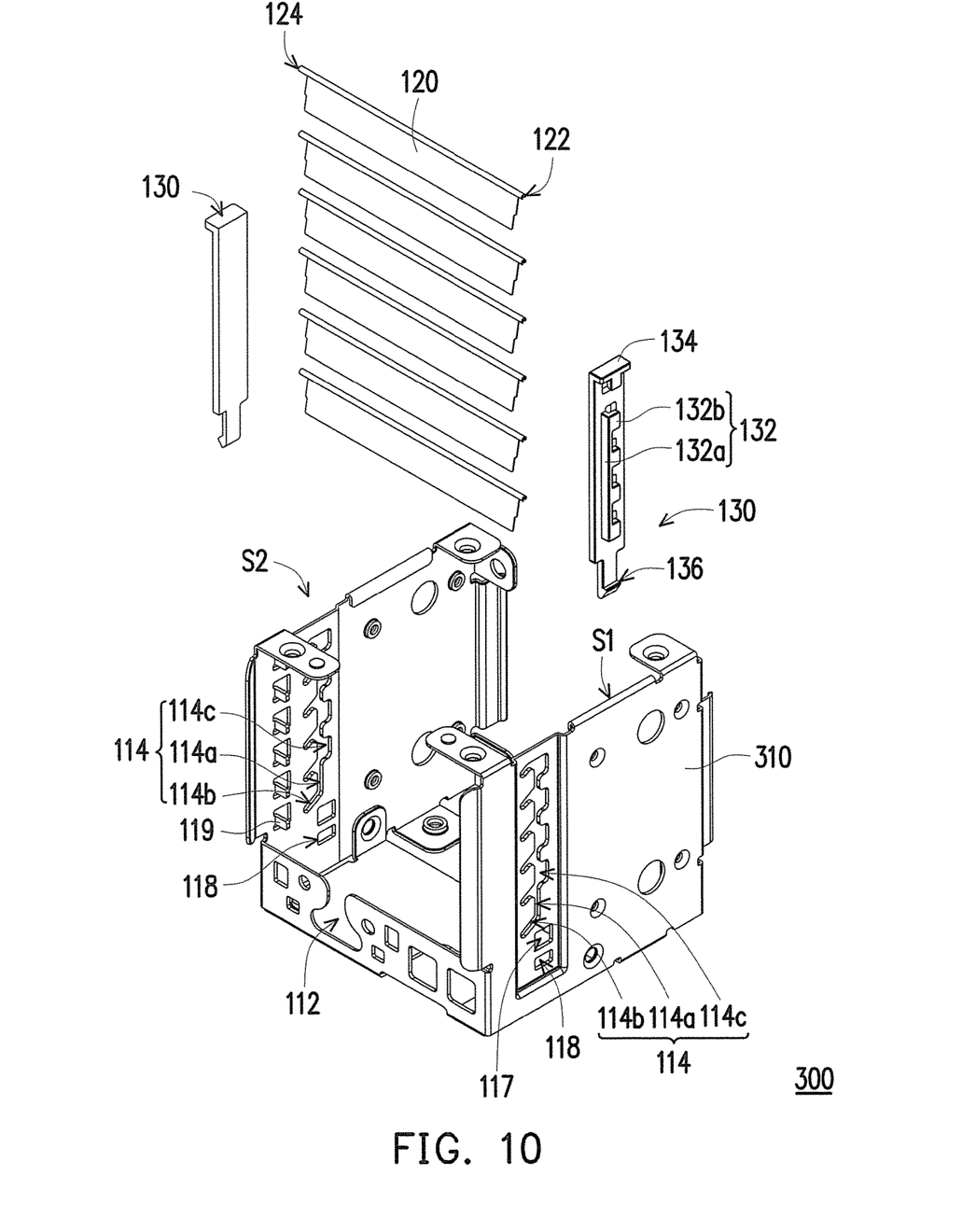
FIG. 10 is a schematic partial view of the heat dissipating module of the third embodiment of the invention.

FIG. 10 is a schematic partial view of the heat dissipating module of the third embodiment of the invention. Referring to FIG. 10, in the present embodiment, a main difference between a heat dissipating module 300 and the aforementioned heat dissipating module 100 lies in that a casing 310 used in the heat dissipating module 300 differs from the casing 110 used in the heat dissipating module 100. Therefore, details of the other members and how they are implemented may be understood by referring to the above description and are thus not repeated herein.

In the present embodiment, the fixing holes 116 used in the casing 110 are omitted in the casing 310, and on the second positioning side S2, a fixing means composed of the sliding recess 114 in combination with the locking element 130 is instead used. In detail, the casing 310 includes two sliding recesses 114 respectively located on the first positioning side S1 and the second positioning side S2. Accordingly, the blades 120 slide into the two sliding recesses 114 respectively to be positioned on the first positioning side S1 and the second positioning side S2. Details of the assembly method of sliding the blades 120 into the sliding recess 114 may be understood by referring to the above description, and is thus not repeated herein. Moreover, since the sliding recesses 114 are adopted on both the first positioning side S1 and the second positioning side S2 of the casing 310, in the present embodiment, whether the blades 120 slide into the corresponding sliding recesses 114 first by the first end 122 or the second end 124 is not limited and may be adjusted according to needs. In addition, since the casing 310 of the present embodiment includes two sliding recesses 114, the heat dissipating module 300 correspondingly includes two locking elements 130. After the blades 120 pass through the two sliding recesses 114 in sequence and are positioned on the first positioning side S1 and the second positioning side S2, the two locking elements 130 respectively pass through the two sliding recesses 114 so as to limit the blades 120 from moving out of the two sliding recesses 114. Details of the assembly method of passing the locking element 130 through the sliding recess 114 as well as the detachment methods of the locking element 130 and the blades 120 may be understood by referring to the above description, and are thus not repeated herein. According to the above, the heat dissipating module 300 of the present embodiment is easily assembled and detached and is stably positioned. Moreover, it is thus known that the numbers of the sliding recess 114 and the locking element 130 and how the sliding recess 114 and the locking element 130 are implemented are not limited in the invention and may be adjusted according to needs.

In summary, in the heat dissipating module of the invention, a sliding recess is disposed on one side of the casing and a fixing hole or another sliding recess is disposed on another side of the casing, such that the blades are easily assembled onto or detached from the casing by sliding into or out of the sliding recess. The sliding recess includes a main passage and a plurality of branches, wherein the main passage is configured to facilitate the blade sliding into the sliding recess, and the branches are configured to further position the blades. Moreover, after the blades are assembled onto the casing, the locking element passes through the sliding recess to limit the blades from moving out of the sliding recess. The locking element may also be detached from the sliding recess so as to allow the blades to be removed from the sliding recess according to needs. In this way, each of the blades independently moves in the sliding recess to be assembled or detached. Moreover, in the above assembly and detachment methods, there is no need to bend the blades or the casing. The assembly method using structural engagement instead of sticking or locking also facilitates the assembly or detachment of the blades. Accordingly, the heat dissipating module of the invention is easily assembled and detached and is stably positioned.

Although the invention has been disclosed with reference to the above embodiments, it will be apparent to persons of ordinary skill in the art that modifications to the described embodiments may be made without departing from the spirit of the invention. Accordingly, the scope of the invention will be defined by the attached claims and not by the above detailed descriptions.

What is claimed is:

1. A heat dissipating module comprising:
   a casing having a first positioning side and a second positioning side opposite each other, and the casing comprising a sliding recess located on the first positioning side;
   a fan disposed in the casing;
   a plurality of blades respectively sliding into the sliding recess and positioned on the first positioning side and the second positioning side; and
   at least one locking element passing through the sliding recess to limit the blades from moving out of the sliding recess.

2. The heat dissipating module according to claim 1, wherein the sliding recess comprises a main passage and a plurality of branches, the blades correspondingly slide into the branches from the main passage, and the locking element passes through the main passage to limit the blades from moving from the corresponding branches to the main passage.

3. The heat dissipating module according to claim 2, wherein an extension direction of each of the branches and an extension direction of the main passage form an acute angle therebetween.

4. The heat dissipating module according to claim 1, wherein the locking element comprises a protrusion structure, the locking element passes through the sliding recess by the protrusion structure and moves relative to the sliding recess to form interference with the sliding recess.

5. The heat dissipating module according to claim 4, wherein the protrusion structure comprises a protruding portion and a plurality of limiting portions connected to the protruding portion, the sliding recess has a plurality of notches, the locking element passes through the sliding recess by the limiting portions of the protrusion structure corresponding to the notches of the sliding recess, and moves relative to the sliding recess by the protruding portion to misalign the limiting portions with the notches, so as to form the interference with the sliding recess.

6. The heat dissipating module according to claim 1, wherein the locking element comprises a first stopper, and the first stopper is positioned on the casing after the locking element passes through the sliding recess.

7. The heat dissipating module according to claim 1, wherein the locking element comprises a second stopper, the casing comprises an avoidance hole and a stopper hole adjacent to each other, the second stopper is located in the avoidance hole when the locking element passes through the sliding recess, and is moved to be fixed in the stopper hole, so as to limit the locking element from moving out of the sliding recess.

8. The heat dissipating module according to claim 1, wherein the casing comprises a plurality of fixing holes located on the second positioning side, and the blades respectively pass through the corresponding fixing holes and slide into the sliding recess so as to be positioned on the first positioning side and the second positioning side.

9. The heat dissipating module according to claim 1, further comprising another locking element, wherein the casing comprises another sliding recess located on the second positioning side, the blades respectively slide into the two sliding recesses to be positioned on the first positioning side and the second positioning side, and the two locking elements respectively pass through the two sliding recesses to limit the blades from moving out of the two sliding recesses.

10. The heat dissipating module according to claim 1, wherein the casing comprises a plurality of limiting elements disposed on the first positioning side or the second positioning side and corresponding to the blades, so as to limit a rotation angle of the blades rotating relative to the casing.

* * * * *